(12) United States Patent
Gao (10) Patent No.: US 11,653,479 B2
(45) Date of Patent: May 16, 2023

(54) MODULAR COOLING UNITS AND ADVANCED DISTRIBUTION HARDWARE FOR RACKS

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 5 days.

(21) Appl. No.: 17/316,368

(22) Filed: May 10, 2021

(65) Prior Publication Data
US 2022/0361376 A1 Nov. 10, 2022

(51) Int. Cl.
*H05K 7/20* (2006.01)

(52) U.S. Cl.
CPC ..... *H05K 7/20818* (2013.01); *H05K 7/20136* (2013.01); *H05K 7/20309* (2013.01); *H05K 7/20318* (2013.01); *H05K 7/20327* (2013.01); *H05K 7/20509* (2013.01)

(58) Field of Classification Search
CPC ... H05K 7/208–20818; H05K 7/20309; H05K 7/20318; H05K 7/20327; G06F 1/20
See application file for complete search history.

(56) References Cited

U.S. PATENT DOCUMENTS

| | | | | |
|---|---|---|---|---|
| 4,550,694 A | * | 11/1985 | Evans | F01P 3/22 252/75 |
| 8,184,436 B2 | * | 5/2012 | Campbell | H05K 7/203 361/701 |
| 9,313,920 B2 | * | 4/2016 | Campbell | F28B 3/04 |
| 9,560,794 B2 | * | 1/2017 | Sato | H05K 7/20745 |
| 9,763,358 B2 | * | 9/2017 | Habert | F25B 33/00 |
| 2005/0132724 A1 | * | 6/2005 | Sharma | F25B 49/005 62/476 |
| 2016/0330873 A1 | * | 11/2016 | Farshchian | H05K 7/20672 |
| 2018/0242478 A1 | * | 8/2018 | Cui | H01R 3/08 |

* cited by examiner

*Primary Examiner* — Zachary Pape
(74) *Attorney, Agent, or Firm* — Womble Bond Dickinson (US) LLP (57) ABSTRACT

A rack cooling system includes a primary cooling condenser and a secondary cooling condenser. The primary cooling condenser is positioned above servers of a server rack and the secondary cooling condenser is position above the primary cooling condenser. Each of the severs, the primary cooling condenser, and the secondary cooling condenser is connected to a liquid manifold via one of a plurality of liquid ports on the liquid manifold, and to the vapor manifold via one of a plurality of vapor ports on the vapor manifold. A cooling capacity of the rack cooling system can be extended by switching on a vapor flow between the secondary cooling condenser and the primary cooling condenser using a first valve on the vapor manifold. Further, a second valve on a primary cooling loop can be used to control cooling fluid flowing into the secondary cooling condenser after the first valve is trigged open.

20 Claims, 8 Drawing Sheets

ND ADVANCED DISTRIBUTION HARDWARE FOR RACKS

MODULAR COOLING UNITS AND ADVANCED DISTRIBUTION HARDWARE FOR RACKS

FIELD OF THE INVENTION

Embodiments of the present disclosure relate generally to cooling systems. More particularly, embodiments of the disclosure relate to a server rack cooling system with multi-level cooling capacities.

BACKGROUND

An efficient thermal management solution can reduce cooling cost for a server rack in a data center. For a thermal management solution to be efficient, it should satisfy the rack power consumption at all time with a minimum cooling capacity buffer, can be self-regulating with the change of the power consumption in the server rack, can have a hardware design that is flexible enough to accommodate the ever changing IT requirements, and can support a phase change cooling system.

With the dynamic changes on the semiconductor and chip technologies, as well as the increasing computing capability for different AI workloads, the power density of these chips has increased dramatically. This results in major challenges to thermal designs for server racks as well as corresponding hardware for the thermal designs.

However, existing thermal management solutions for server racks typically do not support phase change operations properly and efficiently, and may require sophisticated control designs for normal operations, especially under variations of rack power consumptions. Further, the existing thermal management solutions may not be able to adjust the cooling capacity easily, especially when phase change thermal loops are involved.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

According to various embodiment, described herein are systems for implementing a phase change system for use in cooling server racks. The systems are self-regulating, which means that no human intervention or advanced control with sensors are needed for the systems to extend their cooling capacities. Further, the systems are easy to be integrated into different types of server racks via standard interfaces.

In one embodiment, an exemplary rack cooling system includes a primary cooling condenser, and a secondary cooling condenser. The primary cooling condenser is positioned above a server rack that is populated with servers, and the secondary cooling condenser is position above the primary cooling condenser. Each of the severs, the primary cooling condenser, and the secondary cooling condenser is connected to a liquid manifold via one of a plurality of liquid ports on the liquid manifold, and to the vapor manifold via one of a plurality of vapor ports on the vapor manifold. A cooling capacity of the rack cooling system can be extended by switching on a vapor flow between the secondary cooling condenser and the primary cooling condenser using a first valve when vapor pressure in the vapor manifold reaches a predetermined threshold.

In one embodiment, each server in the server rack includes a cold plate, which receives cold liquid the primary cooling condenser and/or the secondary cooling condenser via the liquid manifold, and generates hot vapor by extracting heat from the server. The cold plate may be designed for operating two phase fluid.

In one embodiment, the primary cooling condenser includes one or more primary cooling fans that are to run at a constant speed. The secondary cooling condenser includes one or more secondary cooling fans that are turned on when vapor pressure in the vapor manifold reaches the predetermined threshold. In another embodiment, the secondary cooling fan is kept at a minimum speed, and triggered to the maximum speed when the vapor pressure reaches the threshold.

In one embodiment, the vapor manifold includes a regular section and an extension section. The primary cooling condenser is connected to the regular section and the secondary cooling condenser is connected to the extension section. The first valve is assembled between the secondary cooling condenser and the primary cooling condenser by connecting the extension section and the regular section. The first valve is connected to the extension using an existing port on the vapor manifold or an additional external port, and is connected to the regular section via using another existing port on the vapor manifold or another additional external port. The external ports are not part of a standard vapor manifold.

In one embodiment, the first valve can be positioned between the primary cooling condenser and the secondary cooling condenser, or within the secondary cooling condenser; and can be triggered open when the vapor pressure in the vapor manifold reaches the predetermined threshold.

In an embodiment, the first valve can be trigged open automatically when vapor pressure in the vapor manifold reaches the predetermined threshold, or controlled by a pressure sensor coupled with the first valve. The pressure sensor can be positioned on the server side of the pressure-based valve (i.e., below the pressure-based valve), and is configured to measure the vapor pressure in the vapor manifold and send a command to turn on the first valve when the vapor pressure reaches the predetermined threshold.

In one embodiment, the rack cooling system can further include a primary hardware module configured to connect a primary cooling loop to the primary cooling condenser and the secondary cooling condenser using primary sub-ports. The primary cooling loop can include a second valve that can be used to switch on and off cooling fluid in the primary cooling loop based on vapor pressure in the secondary cooling condenser as measured by a second pressure sensor.

In one embodiment, the second pressure sensor can be positioned on the discharge side of the pressure-based valve (i.e., above the pressure-based valve). When the vapor pressure in the secondary cooling condenser as measured by the secondary pressure sensor reaches another predetermined threshold, which is higher than the predetermined threshold for controlling the first valve, the portion of the primary cooling loop within the secondary cooling condenser can be turned on to cool the phase change loop within the secondary cooling condenser.

In one embodiment, each of the plurality of servers includes a cold plate and is connected to the liquid manifold via one of the plurality of liquid ports, and to the vapor manifold via one of the plurality of vapor ports. The cold plates are part of the phase change system in the rack cooling system. In one embodiment, one or more of the servers may include multiple cold plates connected in either a parallel and/or a series manner.

As such, the various embodiments described above provide designs at the hardware level for facilitating the integration of a two phase change into existing racks without changing the racks' existing architectures.

Figure 1A:
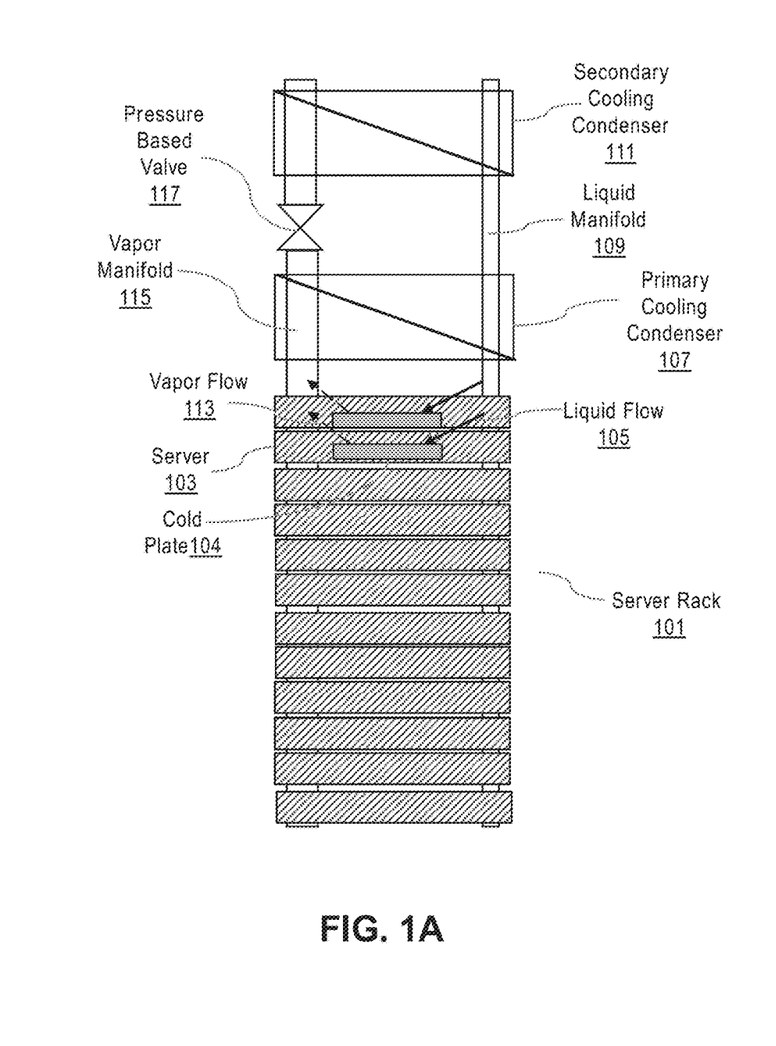
FIGS. 1A-1B show a rack cooling system with major cooling hardware according to an embodiment.
Figure 1B:
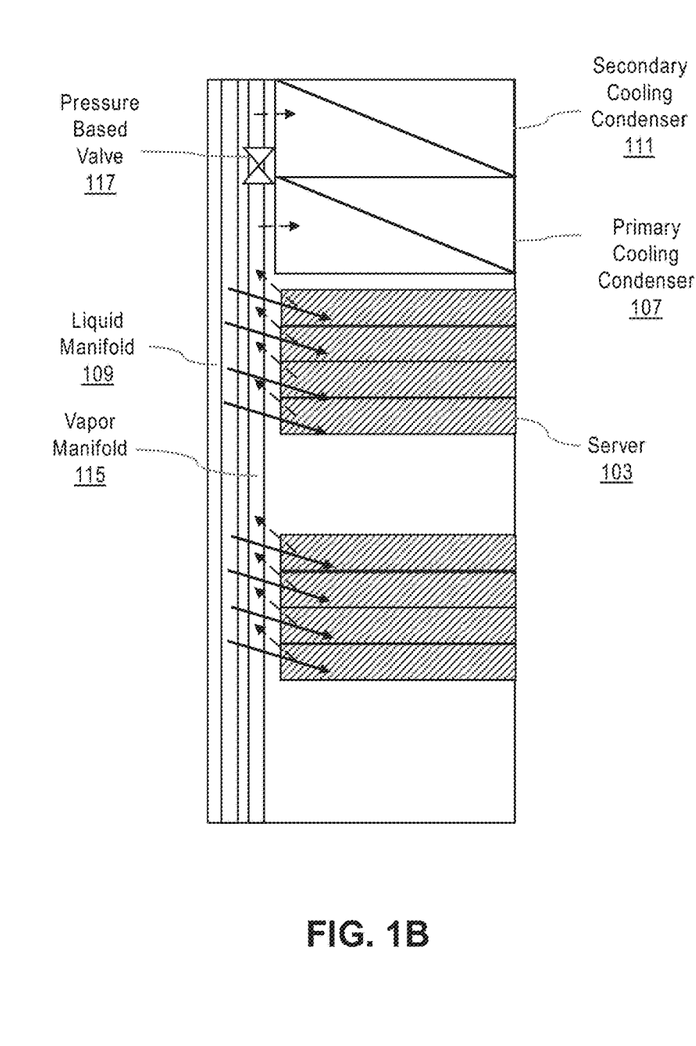

FIGS. 1A-1B show a rack cooling system according to an embodiment. FIG. 1A shows a front view of the rack cooling system, and FIG. 1B shows a side view of the rack cooling system. Even though FIG. 1B is a side view, the two manifolds are intentionally shown to be separated from each other such that the solution can be illustrated clearly. In a typical side view, the two manifolds should be overlapped with each other.

As shown in FIG. 1A, the rack cooling system includes a primary cooling condenser 107 and a secondary cooling condenser 111; a vapor manifold 115 and a liquid manifold 109; and a pressure-based valve 117 on the vapor manifold.

Each of the primary cooling condenser 107 and the secondary cooling condenser 111 can be a heat exchanger used to condense a gaseous substance into a liquid state through cooling. The primary cooling condenser 107 is configured based on a normal rack power consumption level, instead of a possible peak rack power consumption level. The secondary cooling condenser provides additional cooling capacity when the rack power consumption exceeds the normal rack power consumption.

The secondary cooling condenser 111 includes a liquid line and a vapor line (not shown in FIGS. 1A-1B). The liquid line is used to create an all-time connection between the secondary cooling condenser 111 and the liquid manifold 109. Through the all-time connection, liquid, driven by gravity, can move from the secondary cooling condenser 111 to servers deployed to a server rack 101.

The vapor line of the secondary cooling condenser 111 can be used to create a regulated connection between the secondary cooling condenser 111 and the vapor manifold 115. The connection can be regulated by the pressure-based valve 117 on the vapor manifold 115. In one embodiment, while the pressure-based valve 117 is triggered open, the secondary condenser 111 is connected to the rack cooling system, which would extend the cooling capacity of the rack cooling system to accommodate a power consumption that exceeds the average power consumption. When the pressure-based valve is not triggered, the vapor line of the secondary cooling condenser 111 would be cut off, thereby disconnecting the secondary cooling condenser 111 from the rack cooling system.

In one embodiment, the pressure-based valve is triggered open by vapor pressure in the vapor manifold 115. When the vapor pressure builds up to a predetermined level due to a high power consumption condition in the server rack 101, the pressure-based value is triggered open to extend the cooling capacity of rack cooling system.

As shown in FIG. 1, the server rack 101 includes multiple servers, and each server may include a cold plate, which contains phase change fluid for extracting heat from the server. For example, the server rack can include a server 103 with a cold plate 104. Each server can be connected to both the vapor manifold 115 via a vapor line (not shown), and connected to the liquid manifold 109 via a liquid line (now shown). The two cooling condenser 107 and 111, the cold plates in the servers deployed in the server rack 91, the vapor manifold 115, and the liquid manifold 109 form a phase change recirculation loop for cooling the server rack.

A liquid flow 105 can enter the cold plate 104, where the phase change liquid becomes vapor due to the heat extracted from the server 103. A vapor flow 113 can be elevated to the primary cooling condenser 107 and/or the secondary cooling condenser 111. As shown, the vapor manifold 115 can have a larger diameter than the liquid manifold 109 for better performance.

FIG. 1B more clearly shows that each server in the server rack 101 has a vapor line and a liquid line for respectively connecting to the vapor manifold 115 and the liquid manifold 109.

Figure 2:
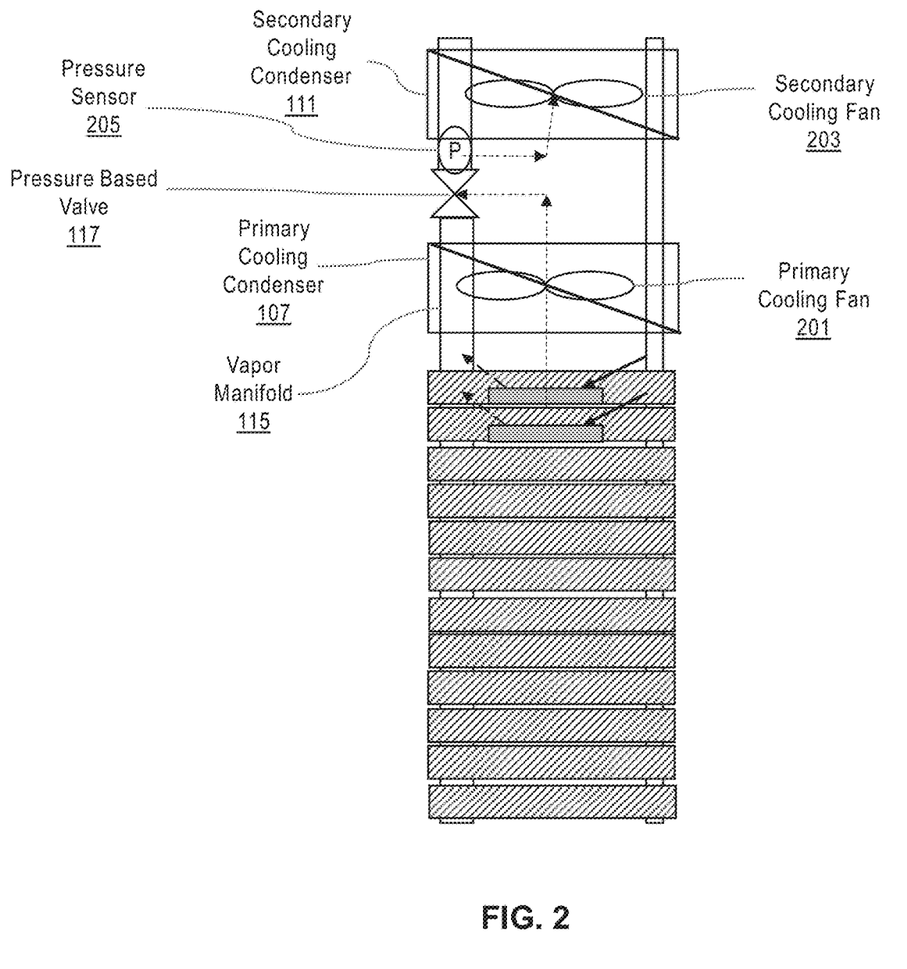
FIG. 2 further illustrates the rack cooling system according to one embodiment.

FIG. 2 further illustrates the rack cooling system according to one embodiment. More specifically, FIG. 2 shows a primary cooling fan 201 integrated with the primary cooling condenser 107, and a secondary cooling fan 203 integrated with the secondary cooling condenser 111. The primary cooling fan 201 can be used for providing cooling airflows to the primary cooling condenser 107 at a constant speed, and the secondary cooling fan 203 can be used for providing cooling airflows to the secondary cooling condenser 111 at the constant speed. In an embodiment, both of the fans 201 and 203 can be set at a constant speed. While the fan 201 can be kept at a constant speed all the time, the fan 203 may be triggered to run at the designed constant speed only when the vapor pressure is higher than the threshold.

A pressure sensor 205 on the discharge side of the pressure-based valve 117 can be used for controlling the secondary cooling fan 203. The pressure sensor 205 can measure the vapor pressure in the vapor manifold 115 once the valve is triggered open. When the vapor pressure in the vapor manifold 115 reaches a predetermined threshold, the secondary cooling fan 203 can be turned on to provide cooling airflows to the secondary cooling condenser 203.

In one embodiment, the threshold for controlling the secondary fan 203 can be equal to or higher than the threshold for triggering open the pressure-based valve 117.

As shown in FIG. 2, the primary cooling condenser 107 does not has its own control mechanism, and therefore is constantly in an operation mode while the rack cooling operation is on. However, the secondary cooling condenser 111 can be put into operation only when the primary cooling condenser 107 cannot handle the cooling needs of the server rack based on configurations.

In one embodiment, at the hardware level, the secondary cooling condenser 111, together with the secondary cooling fan 203, can be installed separately, and can be plugged into the server rack through standard interfaces, e.g., common ports/connectors.

Figure 3:
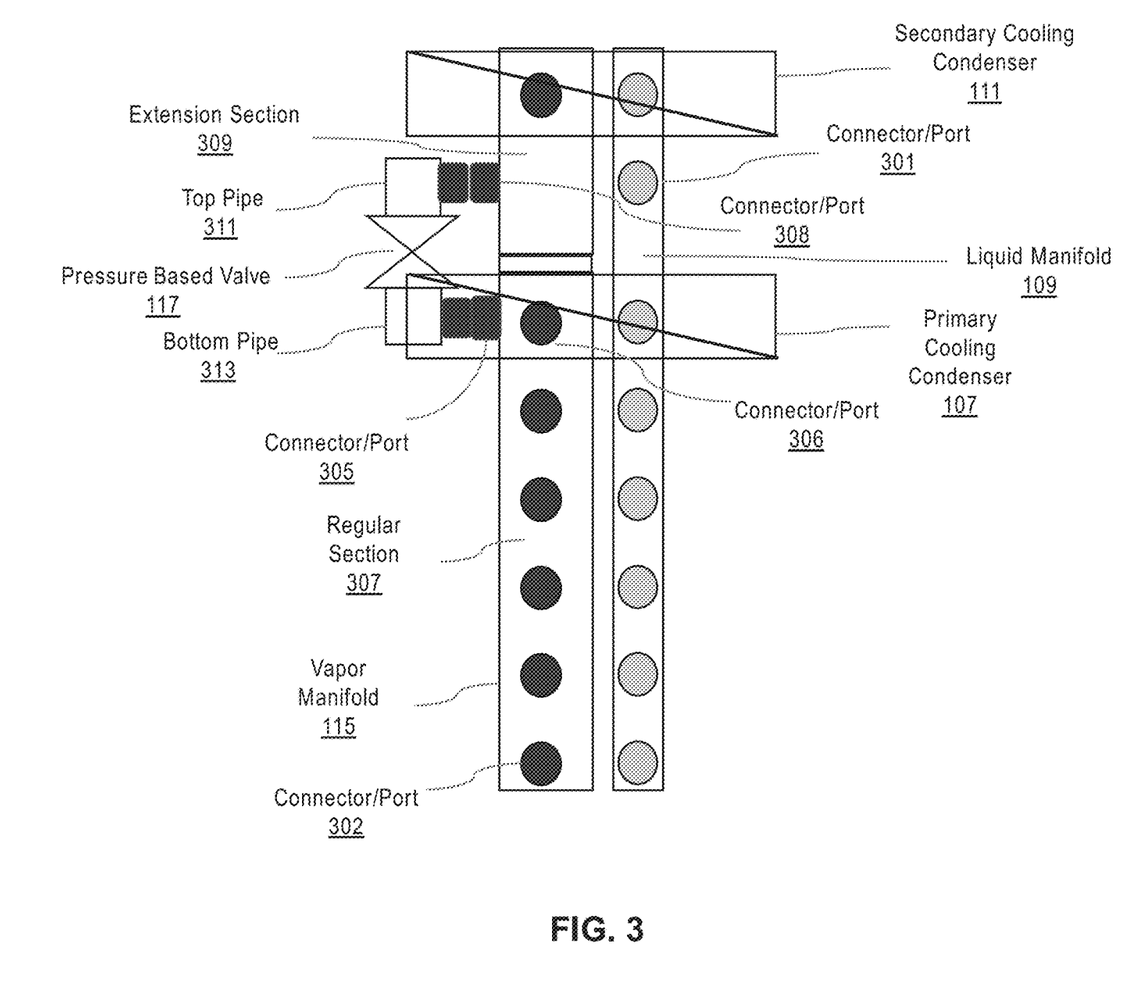
FIG. 3 shows a rack distribution design of the rack cooling system according to one embodiment.

FIG. 3 shows a rack distribution design of the rack cooling system according to one embodiment. As shown in FIG. 3, the vapor manifold 115 can include a regular section 307 and an extension section 309. The extension section 309 is the top portion of the vapor manifold 115, and the regular section 307 is the bottom portion of the vapor manifold 115.

The pressure-based valve 117 can have short pipes 311 and 313 that are connected to the pressure-based valve 117 on the top and at the bottom. The short pipes 311 and 313 and the pressure-based valve form a valve control module.

As shown, in this embodiment, the valve control module is not designed as part of the vapor manifold 115. Rather, it is used as an additional module to connect the regular section 307 and the extension section 309 via connectors/ports. The pressure-based valve (e.g., its position, and the manner it is attached to the vapor manifold 115) can be changed or adjusted based on actual needs of the rack cooling system.

In one embodiment, the vapor manifold 115 can include a set of additional ports 305 and 308 for the valve control module for integrating the secondary cooling condenser 111 with the primary cooling condenser 107. A connector/port 306 on the regular section 307 of the vapor manifold 115 is used to connect the primary cooling condenser 107, and the additional connector/port 305, which is on the same height with the connector/port 306, is used to connect the valve control module to the regular section 307. The additional connector/port 308 on the extension section 309 of the vapor manifold 115 is used to connect the vale control module to the extension section 309.

The vapor manifold 115 can include multiple vapor connectors/ports (e.g., connector/port 302) for connecting to servers in the server rack such that vapor in the servers can be transmitted to the vapor manifold 115. Similarly, the liquid manifold 109 can include multiple fluid connectors/ports for connecting to the servers such that liquid can enter the servers from the liquid manifold 109. In this embodiment, the fluid connectors/ports and the vapor connectors/ports can be designed in different manners for different product designs to accommodate different use cases. All the connectors/ports can be blind mating conneeters/ports.

Figure 4:
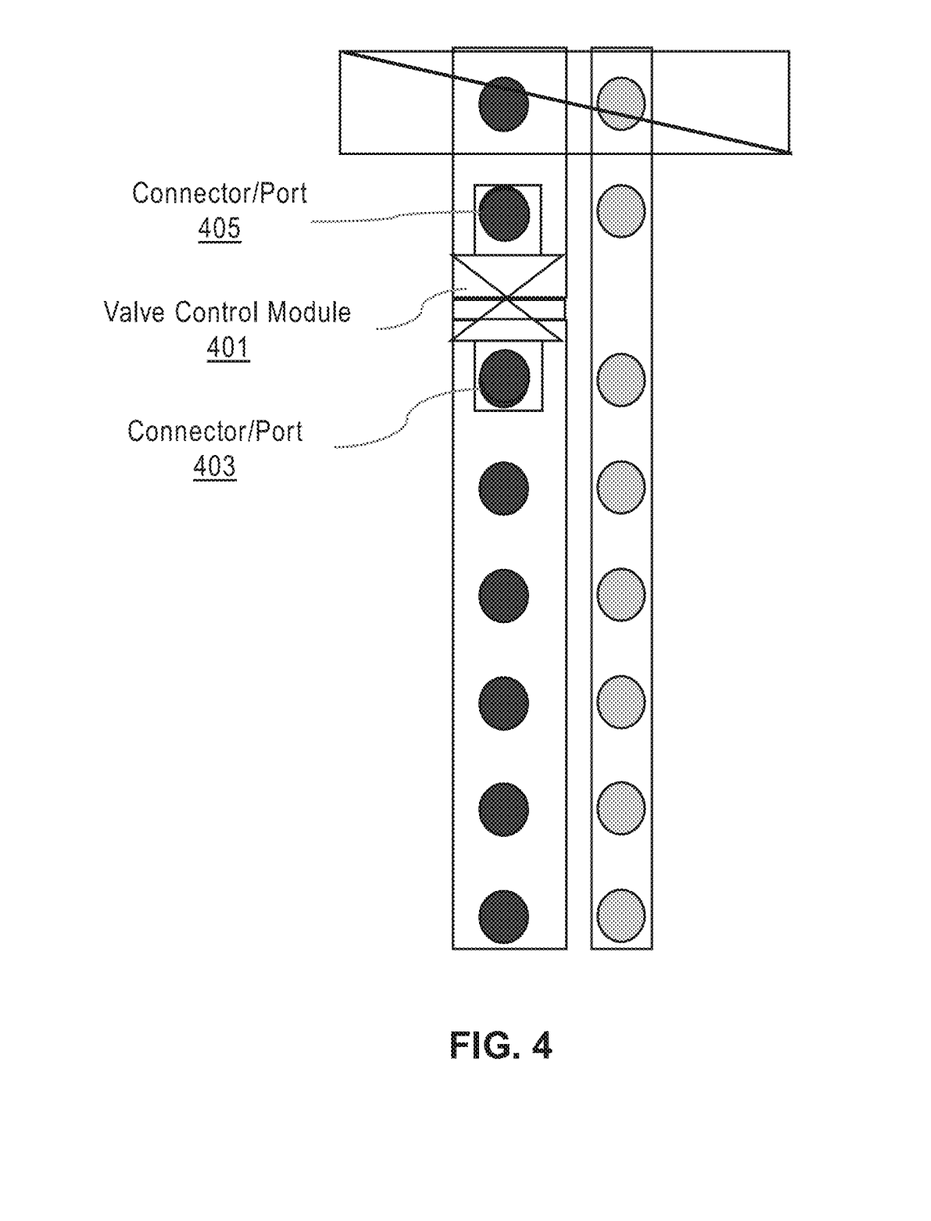
FIG. 4 shows another rack distribution design of the rack cooling system according to one embodiment.

FIG. 4 shows another rack distribution design of the rack cooling system according to one embodiment. In this embodiment, existing connectors/ports (e.g., connector/ports 403 and 405) on the vapor manifold 115 can be used for assembling a valve control module 401 to the rack cooling system. Therefore, unlike the embodiment described in FIG. 3, no additional connectors/ports (e.g., connector/port 305) are needed to assemble the valve control module 401.

The connector/port 403 function as a vapor inlet connector/port, and the connector/port 405 function as an outlet vapor connector/port. The outlet and inlet connectors/ports can be two different connectors/ports as shown in the embodiment in FIG. 4, or can be designed as a unified one in a different embodiment. The connection ports can be more standard for connecting the condensers 107, 111 and the valve control module 401.

Figure 5:
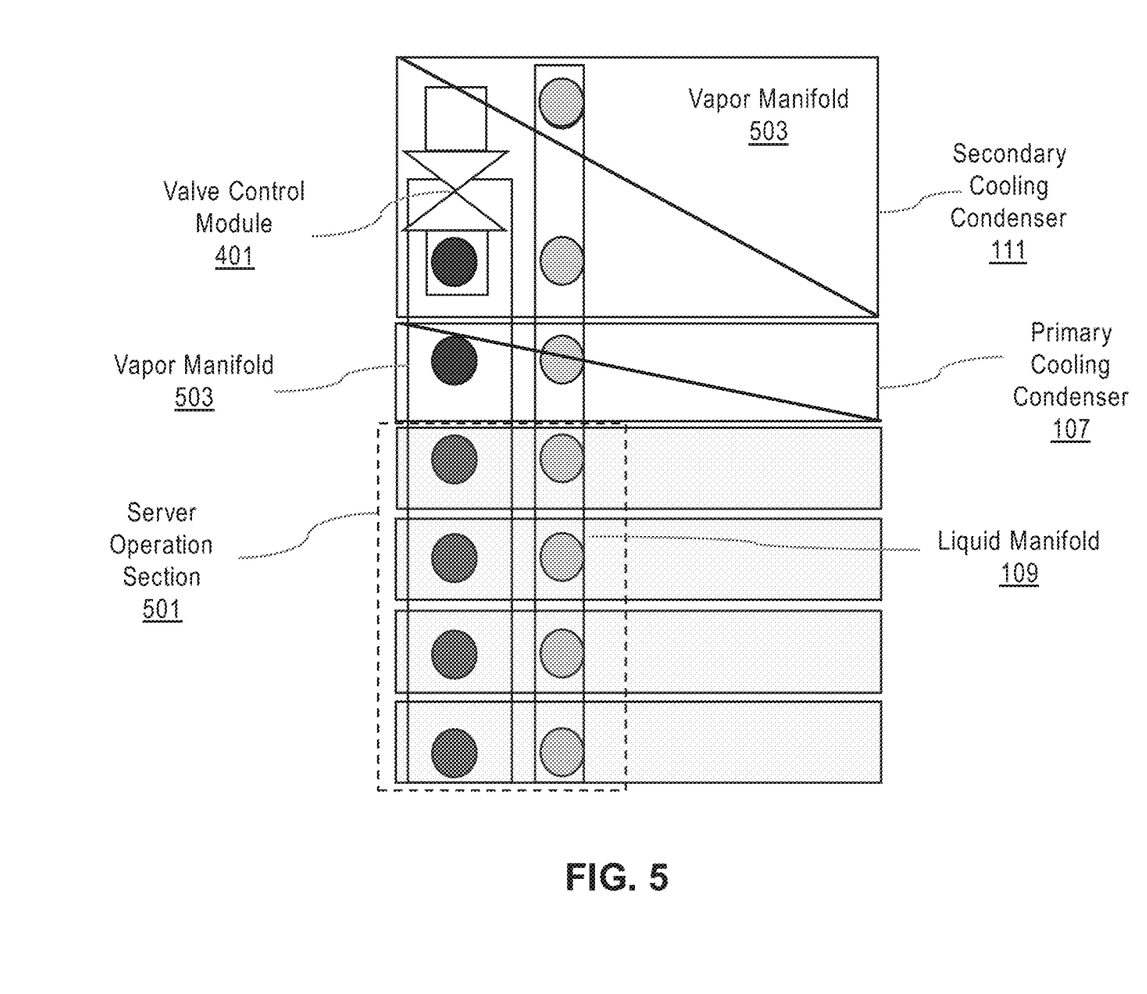
FIG. 5 shows a secondary cooling condenser with a built-in valve control module according to one embodiment.

FIG. 5 shows the secondary cooling condenser 111 with the valve control module 401 built-in according to one embodiment. In one embodiment, a rack-level vapor manifold 501 is a standard manifold in that it comprises one section, unlike the vapor manifold 115 described in FIG. 3 that comprise an extension section 309 and a regular section 307.

Here, in FIG. 5, the rack-level vapor manifold 501 itself can directly connects the secondary cooling condenser 111 and the primary cooling condenser 97, with the valve control module 401 built into the secondary cooling condenser 111 for controlling the secondary cooling condenser 111.

The design described in this embodiment enables the valve control module 401, the secondary cooling condenser 111, and the primary cooling condenser 107 to be populated together with servers in the server rack. Such a design facilitates configurations reconfigurations of the rack cooling system.

In this embodiment, the secondary cooling condenser 111 is a self-contained unit that includes everything needed to extend the cooling capacity of the rack cooling system. At the hardware level, the secondary cooling condenser 111 can be simply plugged into the rack cooling system via standard interfaces, and no additional hardware components are needed for the cooling capacity extension.

Figure 6:
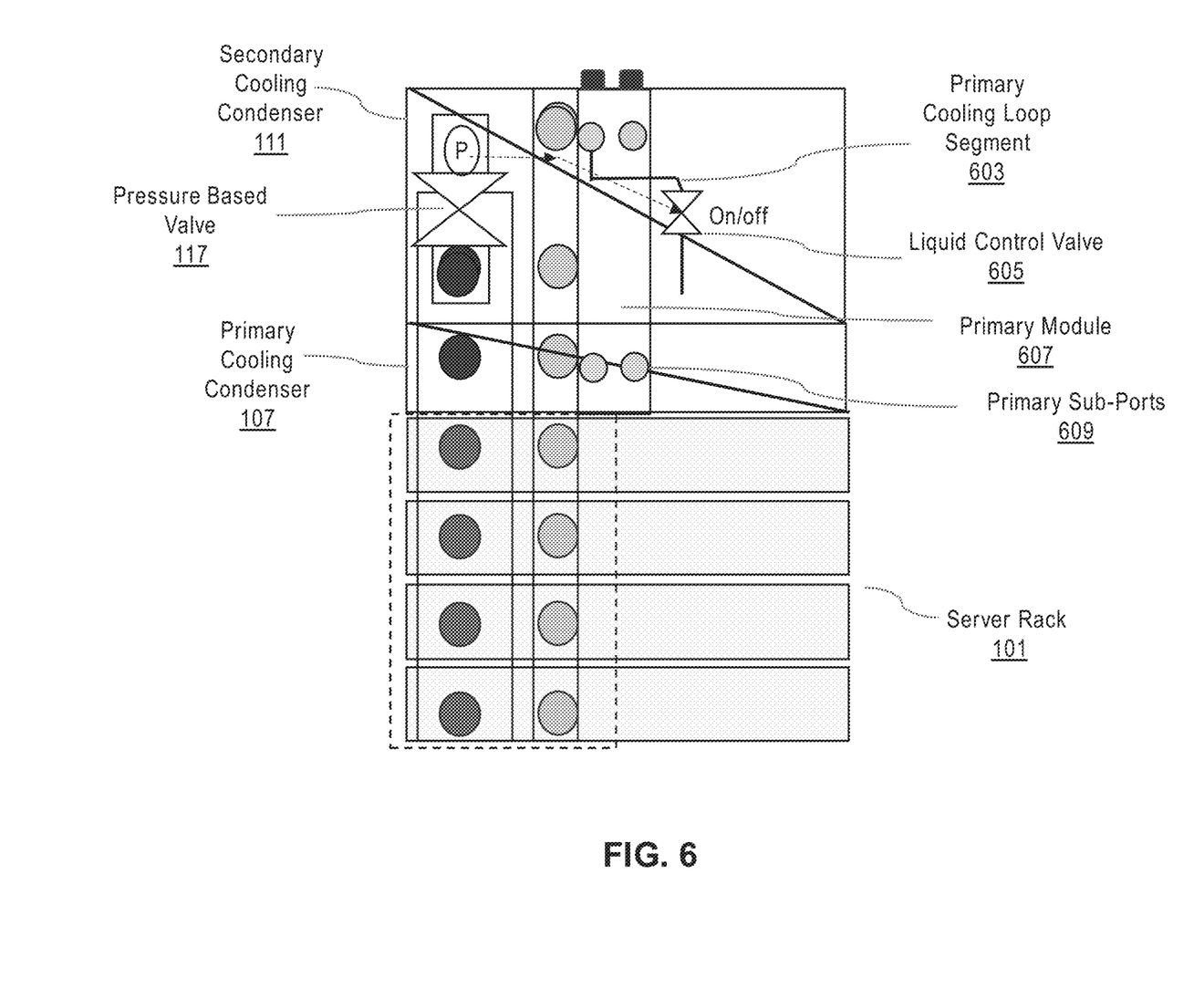
FIG. 6 further shows the rack cooling system according 111 to one embodiment.

FIG. 6 further shows the rack cooling system according 111 to one embodiment. More specifically, FIG. 6 shows a control mechanism within the secondary cooling condenser 111 for regulating fluid flows in a primary cooling loop. FIG. 6 only shows a segment 603 of the primary cooling loop, and in one embodiment, this portion is packaged within the secondary cooling condenser 111.

As shown in FIG. 6, a primary hardware module 607 can connect the primary cooling loop to the primary cooling condenser 107 and the secondary cooling condenser 111 through primary sub-ports (e.g., ports 609). As such, the primary cooling loop is integrated with the primary hardware module 607 and combined as one unit.

In one embodiment, a liquid control valve 605 can be integrated on the primary cooling loop segment 603 to control cooling fluid flows to the secondary cooling condenser 111 during the operation of the phase change system. When the liquid control valve 605 is open, the primary cooling loop segment 603 is turned on to deliver cooling capacity to the secondary cooling condenser 111 to cool the portion of the phase change loop within the secondary cooling condenser 111.

Therefore, both the primary cooling condenser 107 and the secondary cooling condenser 111 are designed to be cooled by the primary cooling loop, with the primary cooling loop segment 603 dedicated to the secondary cooling condenser. While the primary cooling condenser 107 is designed to be cooled all the time with a constant fluid flow rate, the secondary cooling condenser 111 is designed to be cooled by the primary cooling loop segment 603 with the liquid control valve 605 regulating the cooling fluid therein only certain conditions are met.

In one embodiment, the secondary cooling condenser 111 can include the primary cooling loop segment 603, and can connect to the primary hardware module 607 by fluid connectors/connection ports. The primary hardware module 607 can supply cooling fluid to the primary cooling condenser 107 directly, and supply cooling fluid to the secondary cooling condenser 111 via the liquid control valve 605 on the primary cooling loop segment 603.

In one embodiment, the primary cooling loop 603 within the secondary cooling condenser 111 is triggered open to be in operation only when the pressure-based value 117 is triggered open and the vapor pressure on the discharge side (i.e., the side of the secondary cooling condenser 111) of the pressure-based value 117 builds up to a certain level.

Therefore, even when the pressure-based valve 117 is triggered open due to the vapor pressure in the vapor manifold 117 reaching a threshold (e.g., P1), the liquid control valve 605 may not be switched on. Only when additional vapor enters the secondary cooling condenser 111 to cause the vapor pressure in the secondary cooling condenser 111 to reach a higher threshold (e.g., P1+ΔP), the liquid control valve 605 can be switched on such that cooling fluid in the primary cooling loop 603 can start to flow through the secondary cooling condenser 111. The flowing of the cooling liquid in the secondary cooling condenser 111 can generate forced convection cooling, which causes the vapor in the secondary cooling condenser 111 to be converted to liquid, which will be circulated back to the servers driven by gravity.

In one embodiment, no variable speed on controlling a pump is needed in the server rack cooling system, and a constant speed can be used for the entire rack cooling system. Even with a constant speed, the rack cooling system can operate effectively since the cooling capacity of the rack cooling system is delivered two different levels by the two condensers: primary condenser only and two sets of condensers during normal operation.

Figure 7:
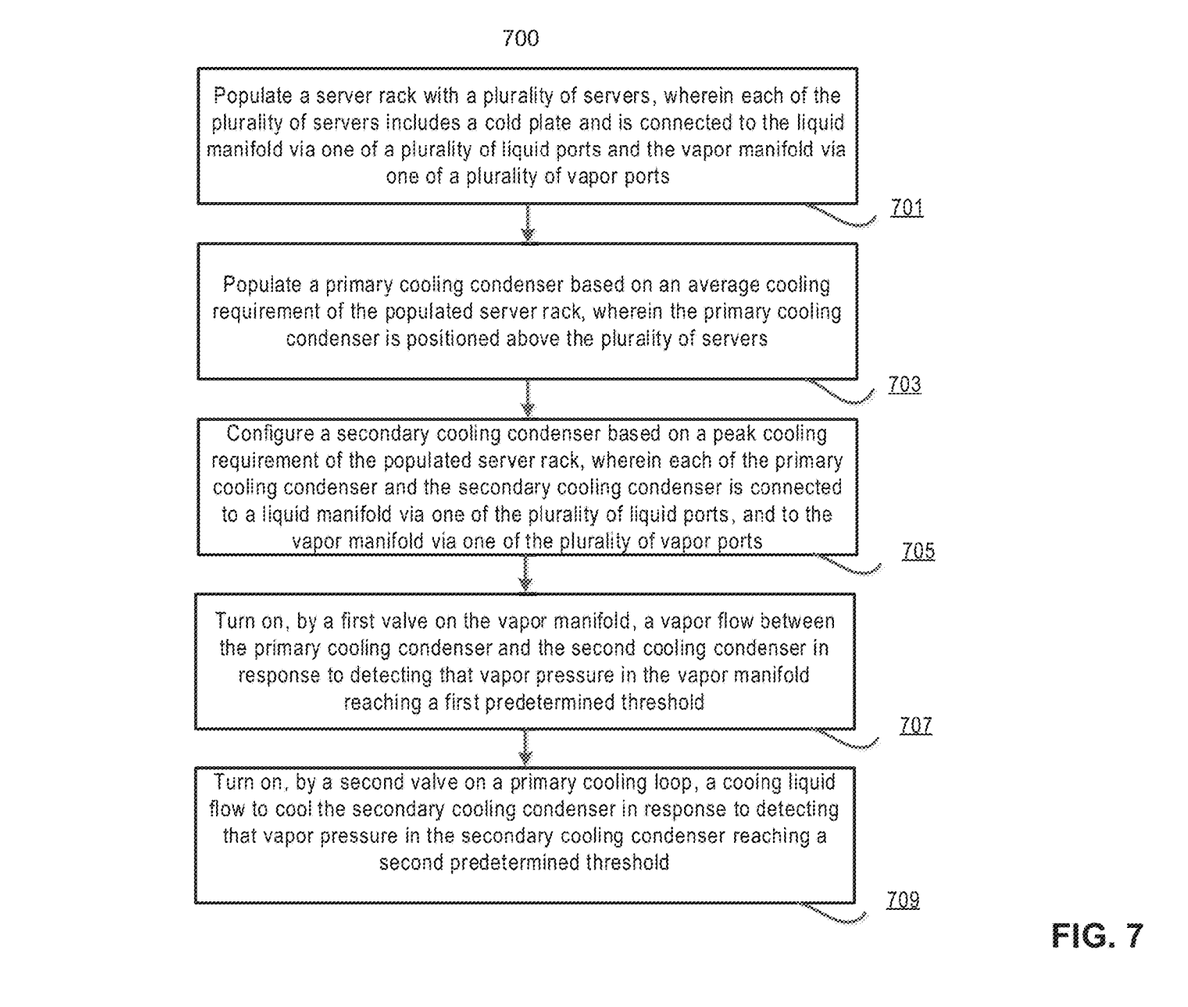
FIG. 7 is a flow diagram illustrating a process 700 of cooling a server rack according to one embodiment.

FIG. 7 is a flow diagram illustrating a process 700 of cooling a server rack according to one embodiment.

In block 701, a server rack is populated with a plurality of servers, and each of the plurality of servers includes a cold plate and is connected to the liquid manifold via one of a plurality of liquid ports and the vapor manifold via one of a plurality of vapor ports. Populating the server with serer includes installing servers in the server rack, configuring the servers, and performing performance turning on the servers.

In block 703, a primary cooling condenser is populated based on an average cooling requirement of the populated server rack. The primary cooling condenser is positioned above the plurality of servers, and is populated with fans, and other components necessary for performing functions of a cooling condenser.

In block 705, a secondary cooling condenser is characterized and configured based on a peak cooling requirement of the populated server rack. Each of the primary cooling condenser and the secondary cooling condenser is connected to a liquid manifold via one of the plurality of liquid ports, and to the vapor manifold via one of the plurality of vapor ports.

In block 707, a vapor flow between the primary cooling condenser and the second cooling condenser is turned on by a first valve in response to detecting that vapor pressure in the vapor manifold reaching a predetermined threshold. In one embodiment, a pressure sensor is on the discharge side of the first valve, and starts to capture vapor pressure in the secondary cooling condenser once the first valve is triggered.

In block 709, a liquid flow can be turned on using a second value on a primary cooling loop to cool the second cooling condenser in response to detecting that vapor pressure in the secondary cooling condenser reaching a predetermined threshold that is higher than the predetermined threshold for controlling the first valve.

Figure 8:
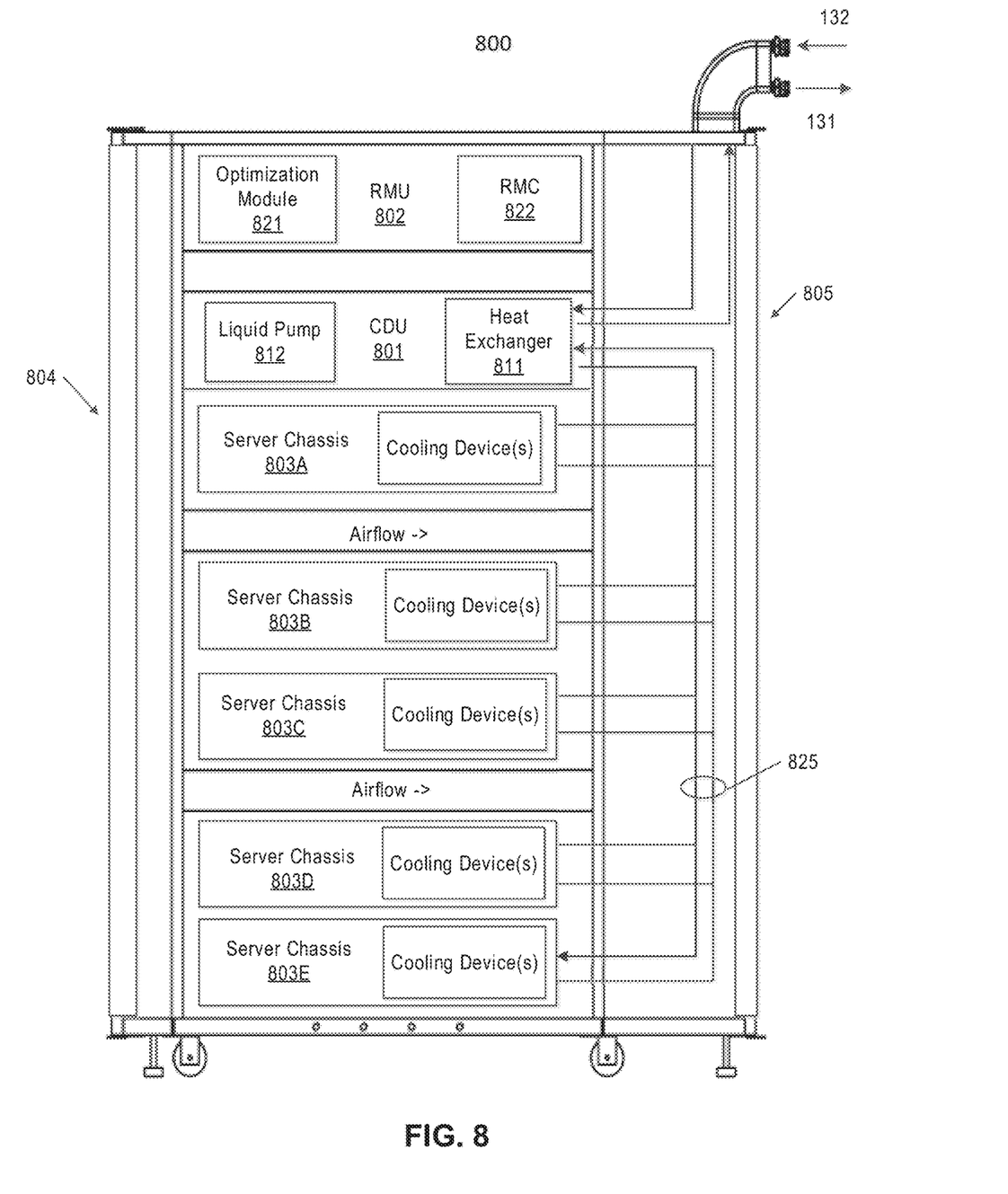
FIG. 8 is block diagram illustrating an electronic server rack according to one embodiment.

FIG. 8 is block diagram illustrating an electronic server rack according to one embodiment. Electronic server rack 800 may represent any of the electronic racks of a data center. Referring to FIG. 8, according to one embodiment, electronic rack 800 includes, but is not limited to, CDU 801, rack management unit (RMU) 802, and one or more server chassis 803A-803E (collectively referred to as server chassis 803). Server chassis 803 can be inserted into an array of server slots (e.g., standard shelves) respectively from frontend 804 or backend 805 of electronic rack 800. Note that although there are five server chassis 803A-803E shown here, more or fewer server chassis may be maintained within electronic rack 800. Also note that the particular positions of CDU 801, RMU 802, and/or server chassis 803 are shown for the purpose of illustration only; other arrangements or configurations of CDU 801, RMU 802, and/or server chassis 803 may also be implemented. In one embodiment, electronic rack 800 can be either open to the environment or partially contained by a rack container, as long as the cooling fans can generate airflows from the frontend to the backend.

In addition, for at least some of the server chassis 803, an optional fan module (not shown) is associated with the server chassis. Each of the fan modules includes one or more cooling fans. The fan modules may be mounted on the backends of server chassis 803 or on the electronic rack to generate airflows flowing from frontend 804, traveling through the air space of the sever chassis 803, and existing at backend 805 of electronic rack 800.

In one embodiment, CDU 801 mainly includes heat exchanger 811, liquid pump 812, and a pump controller (not shown), and some other components such as a liquid reservoir, a power supply, monitoring sensors and so on. Heat exchanger 811 may be a liquid-to-liquid heat exchanger. Heat exchanger 811 includes a first loop with inlet and outlet ports having a first pair of liquid connectors coupled to external liquid supply/return lines 131-132 to form a primary loop. The connectors coupled to the external liquid supply/return lines 131-132 may be disposed or mounted on backend 805 of electronic rack 800. The liquid supply/return lines 131-132, also referred to as room liquid supply/return lines, may be coupled to an external cooling system (e.g., a data center room cooling system).

In addition, heat exchanger 811 further includes a second loop with two ports having a second pair of liquid connectors coupled to liquid manifold 825 (also referred to as a rack manifold) to form a secondary loop, which may include a supply manifold (also referred to as a rack liquid supply line or rack supply manifold) to supply cooling liquid to server chassis 803 and a return manifold (also referred to as a rack liquid return line or rack return manifold) to return warmer liquid back to CDU 801. Note that CDUs 801 can be any kind of CDUs commercially available or customized ones. Thus, the details of CDUs 801 will not be described herein.

Each of server chassis 803 may include one or more IT components (e.g., central processing units or CPUs, general/graphic processing units (GPUs), memory, and/or storage devices). Each IT component may perform data processing tasks, where the IT component may include software installed in a storage device, loaded into the memory, and executed by one or more processors to perform the data processing tasks. Server chassis 803 may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the computing nodes or compute servers (having one or more GPUs) managed by the host server. The compute servers perform the actual tasks, which may generate heat during the operations.

Electronic rack 800 further includes optional RMU 802 configured to provide and manage power supplied to servers 803, and CDU 801. RMU 802 may be coupled to a power supply unit (not shown) to manage the power consumption of the power supply unit. The power supply unit may include the necessary circuitry (e.g., an alternating current (AC) to direct current (DC) or DC to DC power converter, battery, transformer, or regulator, etc.,) to provide power to the rest of the components of electronic rack 800.

In one embodiment, RMU 802 includes optimization module 821 and rack management controller (RMC) 822. RMC 822 may include a monitor to monitor operating status of various components within electronic rack 800, such as, for example, computing nodes 803, CDU 801, and the fan modules. Specifically, the monitor receives operating data from various sensors representing the operating environments of electronic rack 800. For example, the monitor may receive operating data representing temperatures of the processors, cooling liquid, and airflows, which may be captured and collected via various temperature sensors. The monitor may also receive data representing the fan power and pump power generated by the fan modules and liquid pump 812, which may be proportional to their respective speeds. These operating data are referred to as real-time operating data. Note that the monitor may be implemented as a separate module within RMU 802.

Based on the operating data, optimization module 821 performs an optimization using a predetermined optimization function or optimization model to derive a set of optimal fan speeds for the fan modules and an optimal pump speed for liquid pump 812, such that the total power consumption of liquid pump 812 and the fan modules reaches minimum, while the operating data associated with liquid pump 812 and cooling fans of the fan modules are within their respective designed specifications. Once the optimal pump speed and optimal fan speeds have been determined, RMC 822 configures liquid pump 812 and cooling fans of the fan modules based on the optimal pump speeds and fan speeds.

As an example, based on the optimal pump speed, RMC 822 communicates with a pump controller of CDU 801 to control the speed of liquid pump 812, which in turn controls a liquid flow rate of cooling liquid supplied to the liquid manifold 825 to be distributed to at least some of server chassis 803. Similarly, based on the optimal fan speeds, RMC 822 communicates with each of the fan modules to control the speed of each cooling fan of the fan modules, which in turn control the airflow rates of the fan modules. Note that each of fan modules may be individually controlled with its specific optimal fan speed, and different fan modules and/or different cooling fans within the same fan module may have different optimal fan speeds.

Note that the rack configuration as shown in FIG. 8 is shown and described for the purpose of illustration only; other configurations or arrangements may also be applicable. For example, CDU 801 may be an optional unit. The cold plates of server chassis 803 may be coupled to a rack manifold, which may be directly coupled to room manifolds 131-132 without using a CDU. Although not shown, a power supply unit may be disposed within electronic rack 800. The power supply unit may be implemented as a standard chassis identical or similar to a sever chassis, where the power supply chassis can be inserted into any of the standard shelves, replacing any of server chassis 803. In addition, the power supply chassis may further include a battery backup unit (BBU) to provide battery power to server chassis 803 when the main power is unavailable. The BBU may include one or more battery packages and each battery package include one or more battery cells, as well as the necessary charging and discharging circuits for charging and discharging the battery cells.

In one embodiment, the cooling devices disposed in each of the server chassis as shown may represent any cooling device described throughout this application.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

As previously explained, an embodiment of the disclosure may be (or include) a non-transitory machine-readable medium (such as microelectronic memory) having stored thereon instructions, which program one or more data processing components (generically referred to here as a "processor") to perform airflow management operations, such as controlling fan speed of one or more fans of the battery module (and/or BBU shelf). In other embodiments, some of these operations might be performed by specific hardware components that contain hardwired logic. Those operations might alternatively be performed by any combination of programmed data processing components and fixed hardwired circuit components of any of the battery modules described herein.

While certain aspects have been described and shown in the accompanying drawings, it is to be understood that such aspects are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

In some aspects, this disclosure may include the language, for example, "at least one of [element A] and [element B]." This language may refer to one or more of the elements. For example, "at least one of A and B" may refer to "A," "B," or "A and B." Specifically, "at least one of A and B" may refer to "at least one of A and at least one of B," or "at least of either A or B." In some aspects, this disclosure may include the language, for example, "[element A], [element B], and/or [element C]." This language may refer to either of the elements or any combination thereof. For instance, "A, B, and/or C" may refer to "A," "B," "C," "A and B," "A and C," "B and C," or "A, B, and C."

What is claimed is:

1. A rack cooling system, comprising:
a primary cooling condenser positioned above a plurality of servers arranged in a stack within a server rack;
a secondary cooling condenser positioned above the primary cooling condenser;
wherein each of the plurality of servers, the primary cooling condenser, and the secondary cooling condenser is connected to a liquid manifold via one of a plurality of liquid ports, and to a vapor manifold via one of a plurality of vapor ports;

wherein a vapor flow between the secondary cooling condenser and the primary cooling condenser is switched on by a first valve to extend a cooling capacity of the rack cooling system in response to a vapor pressure in the vapor manifold exceeding a first predetermined threshold; and wherein the primary cooling condenser includes one or more primary cooling fans that run at a constant speed, and wherein the secondary cooling condenser includes one or more secondary cooling fans that are turned on when the vapor pressure in the vapor manifold reaches a second predetermined threshold, wherein the second predetermined threshold is equal to or greater than the first predetermined threshold.

2. The rack cooling system of claim 1, wherein each server of the plurality of servers in the server rack includes a cold plate, which receives cold liquid from one or more of the primary cooling condenser or the secondary cooling condenser via the liquid manifold, and generates hot vapor by extracting heat from the server.

3. The rack cooling system of claim 1, wherein the first valve is positioned between the primary cooling condenser and the secondary cooling condenser or within the secondary cooling condenser.

4. The rack cooling system of claim 1, wherein the vapor manifold includes a regular section and an extension section, wherein the primary cooling condenser is connected to the regular section and the secondary cooling condenser is connected to the extension section.

5. The rack cooling system of claim 4, wherein the first valve connects the secondary cooling condenser and the primary cooling condenser by connecting the extension section and the regular section.

6. The rack cooling system of claim 4, wherein the first valve is connected to the extension section via a first of the plurality of vapor ports on the vapor manifold, and is connected to the regular section via a second of the plurality of vapor ports on the vapor manifold.

7. The rack cooling system of claim 4, wherein the first valve is connected to the extension section via a first external port that is not one of the plurality of vapor ports on the vapor manifold, and is connected to the regular section via a second external port that is not one of the plurality of vapor ports on the vapor manifold.

8. The rack cooling system of claim 4, wherein the first valve is integrated into the secondary cooling condenser.

9. The rack cooling system of claim 1, further comprising:
a primary hardware module that is configured to connect a primary change cooling loop to the primary cooling condenser and the secondary cooling condenser using a plurality of primary sub-ports;

wherein a second valve within the secondary cooling condenser is integrated on the primary change cooling loop for use in switching on and off cooling fluid to cool the secondary cooling condenser.

10. The rack cooling system of claim 9, wherein the second valve is switched on when a vapor pressure in the secondary cooling condenser reaches a third predetermined threshold.

11. The rack cooling system of claim 1, wherein each of the plurality of vapor ports and the plurality of liquid ports is a blind mating port.

12. The rack cooling system of claim 1, wherein each of the plurality of servers includes a cold plate and is connected to the liquid manifold via one of the plurality of liquid ports and the vapor manifold via one of the plurality of vapor ports.

13. The rack cooling system of claim 1, where a pressure sensor is coupled with the first valve, wherein the pressure sensor is configured to measure the vapor pressure in the vapor manifold and send a command to turn on the first valve when the vapor pressure reaches the first predetermined threshold.

14. A server rack, comprising:
a plurality of servers arranged in a stack, wherein each of the plurality of servers includes a processor attached to a cold plate and is connected to a liquid manifold via one of a plurality of liquid ports and a vapor manifold via one of a plurality of vapor ports; and a rack cooling system that comprise:
a primary cooling condenser positioned above the plurality of servers,
a secondary cooling condenser positioned above the primary cooling condenser;
wherein each of the primary cooling condenser and the secondary cooling condenser is connected to the liquid manifold via one of the plurality of liquid ports, and to the vapor manifold via one of the plurality of vapor ports;
wherein a vapor flow between the secondary cooling condenser and the primary cooling condenser is switched on by a first valve to extend a cooling capacity of the rack cooling system in response to a vapor pressure in the vapor manifold exceeding a first predetermined threshold; and
wherein the primary cooling condenser includes one or more primary cooling fans that are running at a constant speed, and wherein the secondary cooling condenser includes one or more secondary cooling fans that are turned on when the vapor pressure in the vapor manifold reaches a second predetermined threshold, wherein the second predetermined threshold is equal to or greater than the first predetermined threshold.

15. The server rack of claim 14, wherein the cold plate in each server receives cold liquid from one or more of the primary cooling condenser or the secondary cooling condenser via the liquid manifold, and generates hot vapor by extracting heat from the server.

16. The server rack of claim 14, wherein the first valve is positioned between the primary cooling condenser and the secondary cooling condenser or within the secondary cooling condenser.

17. The server rack of claim 14, wherein the vapor manifold includes a regular section and an extension section, wherein the primary cooling condenser is connected to the regular section and the secondary cooling condenser is connected to the extension section.

18. The server rack of claim 17, wherein the first valve connects the secondary cooling condenser and the primary cooling condenser by connecting the extension section and the regular section.

19. The server rack of claim 17, wherein the first valve is connected to the extension section via a first of the plurality of vapor ports on the vapor manifold, and is connected to the regular section via a second of the plurality of vapor ports on the vapor manifold.

20. The server rack of claim 17, wherein the first valve is connected to the extension section via a first external port that is not one of the plurality of vapor ports on the vapor manifold, and is connected to the regular section via a second external port that is not one of the plurality of vapor ports on the vapor manifold.

\* \* \* \* \*